US 6,583,991 B1

(12) United States Patent
Furuta et al.

(10) Patent No.: US 6,583,991 B1
(45) Date of Patent: Jun. 24, 2003

(54) HIGH AIR FLOW INLET BEZEL

(75) Inventors: Steven J. Furuta, Santa Clara, CA (US); Robert J. Lajara, San Jose, CA (US); Timothy E. Mautz, San Anselmo, CA (US); Thomas E. Stewart, Saratoga, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/121,494

(22) Filed: Apr. 12, 2002

(51) Int. Cl.[7] .............................. H05K 5/00; H05K 5/04; H05K 5/06
(52) U.S. Cl. .................. 361/752; 361/796; 361/688; 361/690; 361/692; 361/687; 361/694; 361/695; 361/703
(58) Field of Search ................... 361/688, 690, 361/692, 687, 695, 694, 703, 752, 796

(56) References Cited

U.S. PATENT DOCUMENTS

| | | | | |
|---|---|---|---|---|
| 5,318,218 A | * | 6/1994 | Mattson | 229/117.25 |
| 5,432,674 A | * | 7/1995 | Hardt | 361/694 |
| 5,673,029 A | * | 9/1997 | Behl et al. | 340/635 |
| 6,164,369 A | * | 12/2000 | Stoller | 165/104.33 |
| 6,297,950 B1 | * | 10/2001 | Erwin | 361/685 |

* cited by examiner

*Primary Examiner*—David Martin
*Assistant Examiner*—Thanh Yen Tran
(74) *Attorney, Agent, or Firm*—O'Melveny & Myers LLP

(57) ABSTRACT

The disclosed device is directed towards an air inlet bezel. The air inlet bezel comprises a body and a system air inlet grill contiguous with the body. A power supply air inlet grill is contiguous with the body and proximate to the system air inlet grill. A pair of ejector tabs is formed in the body. The ejector tabs are configured to manually couple the air inlet bezel to a power supply assembly.

12 Claims, 3 Drawing Sheets

HIGH AIR FLOW INLET BEZEL

FIELD OF THE DISCLOSURE

The present disclosure relates to air cooling units for network computer systems, and more particularly, to an inlet bezel for fan driven air cooling units.

BACKGROUND OF THE DISCLOSURE

Devices for cooling network equipment are well known in the art. Conventional methods utilize either air cooling across the face of the network equipment or liquid cooling circulating liquid within a heat exchanger attached to the equipment. While the process of liquid cooling is effective, higher operating costs result due to higher electrical power needs, expensive dielectric coolants, which pose safety hazards, and substantial amounts of mechanical parts. Therefore, the preferred method is air cooling. However, air cooling also has several drawbacks.

In order to air cool network equipment, while complying with UL safety standards, a fan unit assembly is generally utilized. This fan unit assembly is equipped with an air mover, such as a fan, air filters and an air inlet assembly to protect appendages from the circular motion of the fan. While the device protects the operator, the air inlet assembly can impede the volume of air flow, thereby reducing product efficiency and increasing costs.

Another drawback is the design of the air inlet assembly itself. Conventional designs have obstructions such as struts, which impede air flow through the air inlet. The obstructions reduce cross sectional flow area that restrict mass flow rates and subsequently reduce efficiency.

Conventional designs incorporate assembly features that are costly and time consuming both in the assembly process as well as in post installation maintenance procedures, such as filter replacement. This can be due to an excessive quantity of mechanical parts used to assemble the air inlet and attach the air inlet to the network system as well as the location of the components.

What is needed in the art is an air inlet assembly that has features in which air flow is not impeded, assembly and disassembly is simplified and cost of manufacture and maintenance is reduced while improving reliability and safety.

SUMMARY OF THE DISCLOSURE

The disclosed device is directed towards an air inlet bezel. The air inlet bezel comprises a body and a system air inlet grill contiguous with the body. A power supply air inlet grill is contiguous with the body and proximate to the system air inlet grill. A pair of ejector tabs is formed in the body. The ejector tabs are configured to manually couple the air inlet bezel to a power supply assembly.

DETAILED DESCRIPTION OF THE DISCLOSURE

Those of ordinary skill in the art will realize that the following description of the present disclosed system is illustrative only and not in any way limiting. Other embodiments of the disclosed system will readily suggest themselves to such skilled persons.

Figure 1:
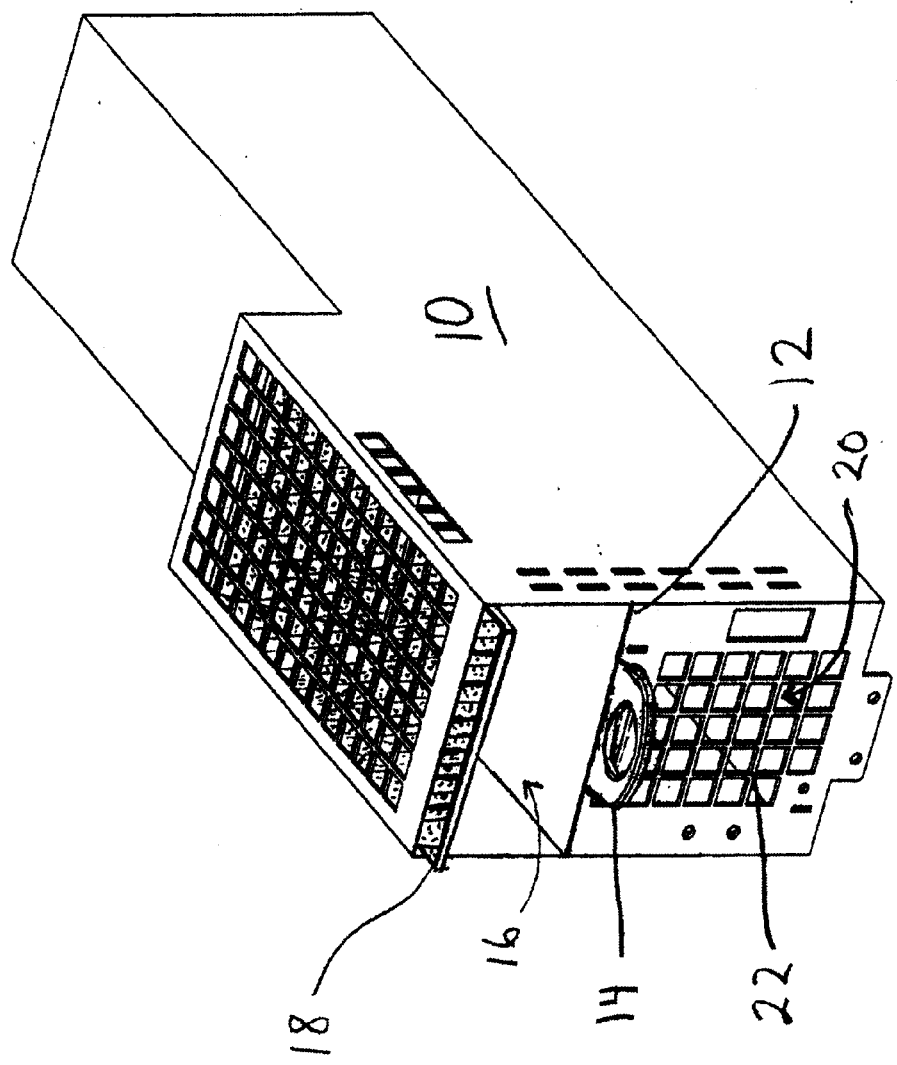
FIG. 1 is a perspective view of an exemplary power supply assembly.

Referring to FIG. 1, an exemplary power supply assembly 10 is illustrated. The power supply assembly 10 includes a front face 12. The front face 12 is accessible to personnel for ease of maintenance. A handle 14 is provided on the front face 12 of the power supply assembly 10. The handle 14 can be grasped by users to move the power supply assembly 10. A system air inlet 16 is defined in the front face 12 of the power supply assembly 10. Cooling air is drawn into the system air inlet 16 for cooling computer system components. A system air filter tray 18 is disposed within the system air inlet 16 supported by the power supply assembly 10. The system filter tray 16 is disposed in the power supply assembly 12 proximate to the front face 14 for easy access through the front face 16. The system air filter tray 18 is removable from the front face 12 for replacement and maintenance. A power supply air inlet 20 is also defined in the front face 12 of the power supply assembly 10. Cooling air is drawn into the power supply air inlet 20 for cooling power supply components. In the embodiment shown in FIG. 1 the power supply air inlet 20 is located proximate to and below the system air inlet 16. In other embodiments the arrangement can be altered such that the system air inlet 16 is below or along the side of the power supply air inlet 20. A grill 22 is defined in the power supply air inlet 20. The grill 22 prevents objects from being inserted into the power supply air inlet 20.

Figure 2:
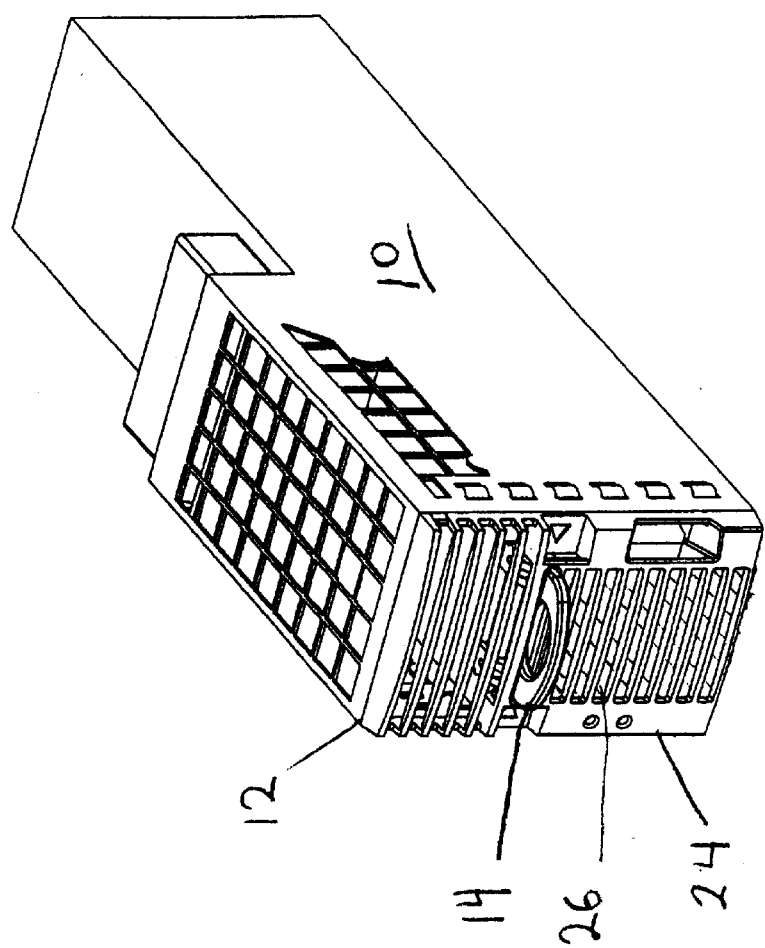
FIG. 2 is a perspective view of an exemplary embodiment of an air inlet bezel with a power supply assembly.

Referring to FIG. 2, an exemplary embodiment of an air inlet bezel 24 attached to the power supply assembly 10 is illustrated. The air inlet bezel 24 demountably attaches (snaps) to the power supply assembly 10 about the handle 14 proximate to the front face 12 of the power supply assembly 10. A power supply air filter 26 is disposed between the air inlet bezel 24 and the front face 12. The cooling air is drawn into the power supply assembly 10 through the air inlet bezel 24 and the power supply air filter 26. The power supply air filter 26 is removable for replacement and maintenance.

Figure 3:
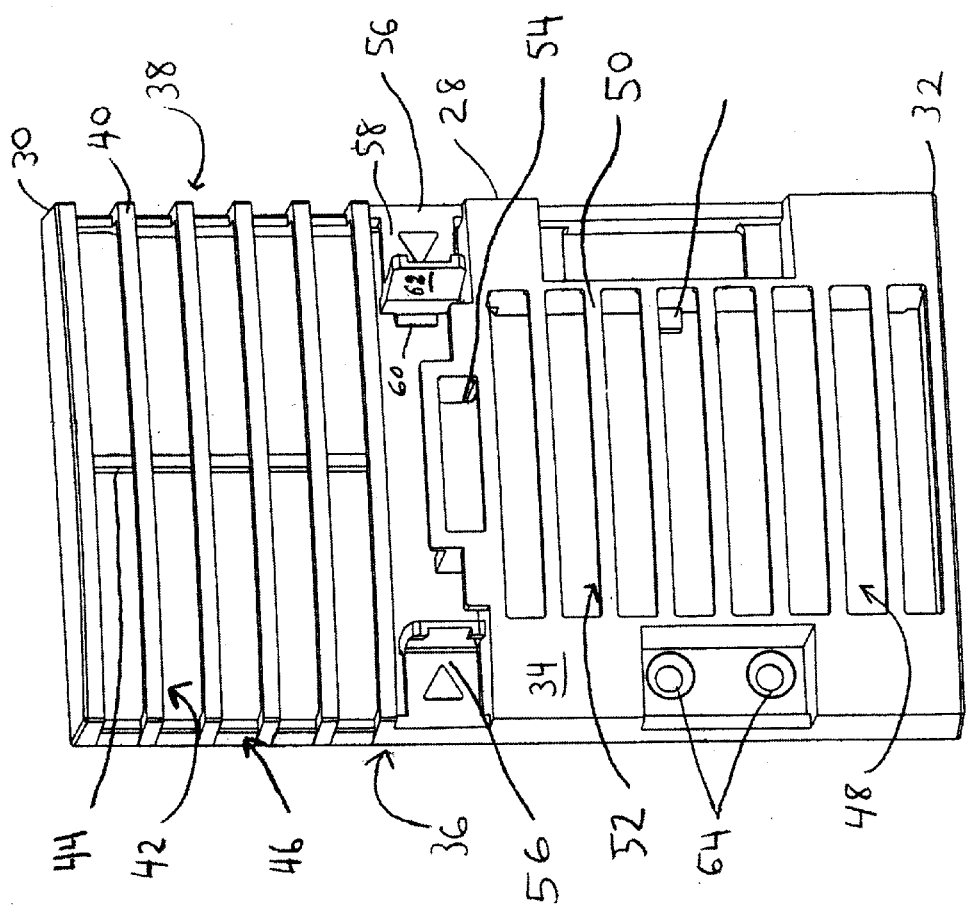
FIG. 3 is a perspective view of an exemplary air inlet bezel.

Referring to FIG. 3, the air inlet bezel 24 is illustrated. The air inlet bezel 24 includes a body 28 formed from a material that has rigid properties and can be formed into multiple shapes, such as plastic. The body 28 includes a first end 30 and a second end 32 opposite the first end 30. The body 28 also includes a face 34 and a back 36 opposite the face 34. The back 36 is adjacent to the front face 12 of the power supply assembly 10 when the air inlet bezel 24 is attached to the power supply assembly 10. A system air inlet grill 38 is defined in the body 28 proximate to the first end 30 and proximate to the system air inlet 16 when the air inlet bezel 24 is attached to the front face 12 of the power supply assembly 10. The system air inlet grill 38 fluidly communicates with the computer system to allow air to flow into the system air inlet 16 for cooling while preventing finger sized objects from entering the system air inlet 16. The system air inlet grill 38 is defined in the body 28 by grill members 40, that are formed contiguous with the body 28 into a grill pattern 42. In the preferred embodiment, the grill pattern 42 includes a center stiffener 44 spanning across an array of grill members 40. The grill pattern 42 also includes side inlet vents 46 at opposite sides of the grill pattern 42. The side inlet vents 46 allow cooling air to pass in more than one plane, thereby increasing the flow area into the system. A power supply air inlet grill 48 is also defined in the body 28 proximate to the second end 32 and proximate to the power supply air inlet 20 when the air inlet bezel 24 is attached to the front face 12 of the power supply assembly 10. The power supply air inlet grill 48 fluidly communicates with the power supply to allow air to flow into the power supply air inlet grill 48 for cooling while preventing finger sized objects from entering the power supply air inlet 20. The power supply air inlet grill 48 is defined in the body 28 by grill members 50, that are formed contiguous with the body 28 into a second grill pattern 52. At least one filter bracket 54 is disposed in the body 28 proximate to the back 36 of the air inlet bezel 24. The filter bracket 54 demountably couples the power supply air filter 26 to the air inlet bezel 24 proximate to the power supply air inlet 20. The power supply air filter 26 can be easily maintained and replaced with this arrangement.

Still referring to FIG. 3, a mounting slot 54 is disposed in the body 28 between the system air inlet grill 38 and the power supply air inlet grill 48. The mounting slot 54 is configured to receive the handle 14, such that the handle 14 passes through the mounting slot 54 disposed in the body 28. The mounting slot 54 allows the handle 14 to be accessed for use while the air inlet bezel 24 fits securely to the front face 12 of the power supply assembly 10. A pair of ejector tabs 56 is formed in the body 28. Each ejector tab 56 includes a base 58 formed in the body 28, as well as at least one latch member 60 protruding from the base 58 for coupling to the side of the handle 14. The latch 60 couples the ejector tab 56 with the handle 14. The handle 14 can have indents (not shown) formed in the sides for receiving the latch 60. A tab section 62 is formed in the ejector tab 56 distal from the base 58 for manipulation by a user, for coupling and decoupling the air inlet bezel 24 with the power supply assembly 10. The ejector tabs 56 are configured to latch to the handle 14 to secure the air inlet bezel 24 to the power supply assembly 10. The ejector tabs 56 are flexibly biased, such that the ejector tabs 56 flex to pass over the handle 14 and then bias against the sides of the handle 14 for mounting. The ejector tabs 56 disengage from the handle 14 for decoupling of the inlet air bezel 24 from the power supply assembly 10. The ejector tabs 56 are manually operated to make the process of mounting and dismounting the air inlet bezel 24 with the power supply assembly 10 a tool free operation. Light Emitting Diode (LED) apertures 64 are disposed in the body 28 proximate to the power supply air inlet grill 48. The LED apertures 64 receive LEDs inserted through the LED apertures 64 to allow for the LEDs to be viewed by observers outside the power supply assembly 10.

The air inlet bezel 24 allows for the maximum open area for air to flow into the system. The air inlet bezel 24 has about 3,000 square millimeters of flow area for cooling air to pass through. Inlet air flow impedance, that is, the resistance to air flowing past the air inlets, is substantially reduced by the configuration of the air inlet bezel 24. The estimated improvement of cooling capacity is an increase in inlet cooling by about 21% as a result of the reduced air flow impedance and the enlarged flow area. The reduction in air flow impedance improves the cooling capacity resulting in improved electronic system reliability. Additionally, the manual operation of coupling and decoupling the air inlet bezel 24 as a result of the elimination of threaded assembly fasteners greatly reduces the cost of manufacture and maintenance. The filters 18, 26 are more easily accessed and maintained. Service costs are reduced as well as the parts inventory for the air inlet bezel. The improvements to the air inlet bezel 24 may also be manufactured to be U/L listed.

While embodiments and applications of this disclosure have been illustrated and described, it would be apparent to those skilled in the art that many more modifications than mentioned above are possible without departing from the inventive concepts herein. The disclosure, therefore, is not to be restricted except in the spirit of the appended claims.

What is claimed is:

1. An air inlet bezel comprising:

a body;

a system air inlet grill contiguous with said body;

a power supply air inlet grill contiguous with said body proximate to said system air inlet grill;

a pair of ejector tabs formed in said body, said ejector tabs configured to manually couple the air inlet bezel to a power supply assembly, wherein said pair of ejector tabs each includes a base proximate to said body and a latch formed in said base biased to couple to a handle attached to said power supply assembly and a tab section distal from said base configured to be manually manipulated.

2. The air inlet bezel of claim 1 wherein said system air inlet grill includes a grill pattern configured to prevent insertion of finger sized objects.

3. The air inlet bezel of claim 2 wherein said grill pattern includes grill members coupled to a center stiffener.

4. The air inlet bezel of claim 1 wherein said power supply air inlet grill includes a second grill pattern configured to prevent insertion of finger sized objects.

5. The air inlet bezel of claim 1 wherein said body includes a mounting slot defined in said body between said system air inlet grill and said power supply air inlet grill configured to receive a handle coupled to said power supply assembly allowing said handle to be grasped by a user.

6. The air inlet bezel of claim 1 wherein the air inlet bezel snaps onto and off of said power supply assembly for access to a system air filter tray and a power supply air filter.

7. The air inlet bezel of claim 6 wherein said power supply air filter is coupled to a mounting slot disposed on said body of the air inlet bezel.

8. The air inlet bezel of claim 1 wherein said system air inlet grill and said power supply air inlet grill are configured for low air flow impedance.

9. The air inlet bezel of claim 1 wherein said system air inlet grill is proximate to a system air inlet when the air inlet bezel is attached to said power supply assembly.

10. The air inlet bezel of claim 1 wherein said power supply air inlet grill is proximate to a power supply air inlet when the air inlet bezel is attached to said power supply assembly.

11. The air inlet bezel of claim 1 wherein said system air inlet grill includes side inlet vents.

12. The air inlet bezel of claim 1 wherein said body includes LED apertures disposed in said body, each of said LED apertures is configured to receive an LED.

\* \* \* \* \*